US011744025B2

(12) United States Patent
Takahashi et al.

(10) Patent No.: US 11,744,025 B2
(45) Date of Patent: Aug. 29, 2023

(54) PHOTOSENSOR COMPRISING A FIRST CIRCUIT BOARD WITHIN A HOUSING HAVING A THROUGH HOLE WITH A CABLE FOR CONNECTING A SECOND CIRCUIT BOARD AND METHOD OF MANUFACTURING THE SAME

(71) Applicant: OMRON Corporation, Kyoto (JP)

(72) Inventors: Shunya Takahashi, Kyoto (JP); Hirotaka Nakashima, Fukuchiyama (JP); Jumpei Nakamura, Kyoto (JP); Tomonari Kawakami, Kyoto (JP)

(73) Assignee: OMRON Corporation, Kyoto (JP)

( * ) Notice: Subject to any disclaimer, the term of this patent is extended or adjusted under 35 U.S.C. 154(b) by 204 days.

(21) Appl. No.: 17/432,101

(22) PCT Filed: Mar. 10, 2020

(86) PCT No.: PCT/JP2020/010316
§ 371 (c)(1),
(2) Date: Aug. 19, 2021

(87) PCT Pub. No.: WO2020/189416
PCT Pub. Date: Sep. 24, 2020

(65) Prior Publication Data
US 2022/0201875 A1    Jun. 23, 2022

(30) Foreign Application Priority Data
Mar. 15, 2019    (JP) ................................ 2019-048468

(51) Int. Cl.
*H05K 1/14*    (2006.01)
*H05K 5/00*    (2006.01)
*G01J 1/42*    (2006.01)

(52) U.S. Cl.
CPC .............. *H05K 5/0026* (2013.01); *G01J 1/42* (2013.01)

(58) Field of Classification Search
CPC ... H05K 1/14; H05K 1/11; H05K 3/36; H05K 5/00; H05K 1/18; G01J 1/42; G01J 1/44; H01R 12/79; H01R 12/71; H01R 13/10
(Continued)

(56) References Cited

U.S. PATENT DOCUMENTS 7,297,017 B2 * 11/2007 Chien ................ H01R 13/6335
439/476.1
2017/0200529 A1    7/2017 Neumann et al.
2017/0254700 A1    9/2017 Mizusaki et al.

FOREIGN PATENT DOCUMENTS

CN    1122099    5/1996
CN    101064388    10/2007
(Continued)

OTHER PUBLICATIONS

"Office Action of Korea Counterpart Application", dated Apr. 18, 2023, with English translation thereof, p. 1-p. 8.
(Continued)

*Primary Examiner* — Que Tan Le
(74) *Attorney, Agent, or Firm* — JCIPRNET

(57) ABSTRACT

Provided is a photosensor in which a cable can be easily mounted on a circuit board. A photosensor is provided with: a housing; a cable; a first circuit board; and a second circuit board. A through-hole is formed in the housing. The cable is inserted into the through-hole. The first circuit board and the second circuit board are accommodated in the housing. The first circuit board is provided with a first connector. The second circuit board has a first portion and a second portion. The cable is soldered to the first portion. The second portion is provided with a second connector. The second connector
(Continued)

is inserted into the first connector. The second circuit board connects the cable and the first circuit board.

7 Claims, 6 Drawing Sheets

(58) Field of Classification Search
USPC .............................................. 250/214 R, 239
See application file for complete search history.

(56) References Cited

FOREIGN PATENT DOCUMENTS

| | | |
|---|---|---|
| CN | 202145301 | 2/2012 |
| CN | 104181653 | 12/2014 |
| CN | 107463050 | 12/2017 |
| CN | 108513480 | 9/2018 |
| CN | 109831086 | 5/2019 |
| CN | 109983852 | 7/2019 |
| DE | 4434011 | 7/1995 |
| DE | 19820358 | 8/1999 |
| EP | 2523268 | 11/2012 |
| JP | S5794992 | 6/1982 |
| JP | 2004257857 | 9/2004 |
| JP | 2007003348 | 1/2007 |
| JP | 2007053144 | 3/2007 |
| JP | 2011192794 | 9/2011 |
| JP | 2012088571 | 5/2012 |
| JP | 2017135349 | 8/2017 |

OTHER PUBLICATIONS

"International Search Report (Form PCT/ISA/210) of PCT/JP2020/010316," dated Jun. 30, 2020, with English translation thereof, pp. 1-4.
"Written Opinion of the International Searching Authority (Form PCT/ISA/237) of PCT/JP2020/010316," dated Jun. 30, 2020, with English translation thereof, pp. 1-8.
Bo-Ming Zhang et al., "Investigation on Status and Prospective Application of Composite Multifunctional Structures Technology," Journal of Astronautics, vol. 28 No. 2, Mar. 2007, pp. 493-497.
"Office Action of China Counterpart Application" with English translation thereof, dated Mar. 2, 2022, p. 1-p. 24.
"Search Report of Europe Counterpart Application", dated Nov. 15, 2022, pp. 1-8.

* cited by examiner

PHOTOSENSOR COMPRISING A FIRST CIRCUIT BOARD WITHIN A HOUSING HAVING A THROUGH HOLE WITH A CABLE FOR CONNECTING A SECOND CIRCUIT BOARD AND METHOD OF MANUFACTURING THE SAME

CROSS-REFERENCE TO RELATED APPLICATION

This application is a 371 application of the International PCT application serial no. PCT/JP2020/010316, filed on Mar. 10, 2020, which claims the priority benefits of Japan Patent Application No. 2019-048468, filed on Mar. 15, 2019. The entirety of each of the above-mentioned patent applications is hereby incorporated by reference herein and made a part of this specification.

BACKGROUND

Technical Field

The disclosure relates to a photosensor.

Description of Related Art

In a photosensor such as a photoelectric sensor or an image sensor, a circuit board that constitutes a control part or the like is built in a housing. A cable penetrates through the housing and is connected to the circuit board in order to supply power from outside the housing to the circuit board and transmit a signal processed by the circuit board to outside of the housing.

RELATED ART

Patent Document(s)

[Patent Document 1] Japanese Patent Application Laid-Open No. 2004-257857
[Patent Document 2] Japanese Patent Application Laid-Open No. 2007-3348

SUMMARY

Problems to be Solved

For example, FIG. 3 of Patent Document 1 and FIG. 2 of Patent Document 2 disclose a configuration in which the tip of a cable inserted into a housing is soldered to a circuit board. In the assembly of the photosensor, the work of soldering and mounting the cable to the circuit board is a heavy burden on the operator. In particular, if the cable is fixed to the housing, since the tip of the cable cannot be moved freely, the mounting work becomes difficult.

In Patent Documents 1 and 2, the tip of the cable is extended to facilitate soldering. Therefore, a space for folding and housing the extended cable is required, and the size of the housing increases accordingly. Since photosensors are generally installed inside factory production lines and equipment, a compact housing is desired.

Therefore, an objective of the disclosure is to provide a photosensor in which a cable can be easily mounted on a circuit board.

Means for Solving the Problems

A photosensor according to an embodiment of the disclosure includes a housing, a cable, a first circuit board, and a second circuit board. A through-hole is formed in the housing. The cable is inserted through the through-hole. The first circuit board and the second circuit board are housed in the housing. The first circuit board is provided with a first connector. The second circuit board has a first portion and a second portion. The cable is soldered to the first portion. The second portion is provided with a second connector. The second connector is inserted into the first connector. The second circuit board connects the cable and the first circuit board.

A method of manufacturing a photosensor according to an embodiment of the disclosure includes a step of housing a first circuit board in a housing, a step of soldering a cable to a second circuit board to connect the second circuit board and cable, a step of inserting from a through-hole the second circuit board soldered with the cable and arranging in the housing, and a step of inserting a second connector into a first connector to connect the first circuit board and the second circuit board. The through-hole is formed in the housing. The first circuit board is provided with the first connector. The second circuit board is provided with the second connector that may be inserted into and removed from the first connector.

According to these embodiments, the cable can be easily mounted on the first circuit board via the second circuit board. In the housing, the second connector may be simply inserted into the first connector. Since the cable is soldered in advance outside the housing and connected to the second circuit board, soldering inside the housing can be omitted. Since it is not necessary to extend the tip of the cable and solder it, the housing can be compactly configured by omitting the space for housing the extended cable.

In the above embodiment, it is preferable that at least a part of the printed wiring board of the second circuit board is composed of a flexible board instead of a rigid board. The printed wiring board of the second circuit board may all be a flexible board, or may be a flex-rigid board combining a flexible board and a rigid board.

According to this embodiment, since the second circuit board can be elastically deformed, it is easy to insert the second connector into the first connector. The second circuit board with the cable connected can be easily mounted on the first circuit board.

In the above embodiment, the first portion may be composed of a flexible board and may be formed in a size incapable of passing through the through-hole in a non-elastically deformed state but capable of passing through the through-hole in an elastically deformed state.

According to this embodiment, since the first portion may be elastically deformed, even if the first portion is larger than the through-hole, it can be passed through the through-hole. Since a large area partitioned in the first portion for soldering the cable can be secured, it is easy to solder the cable to the second circuit board. The connection reliability between the second circuit board and the cable can be improved. If the gap between the strands is too narrow, solder may flow to the adjacent strand and cause a short circuit, or a high-temperature soldering iron may come into contact with the adjacent strand and cause damage.

In the above embodiment, the cable may be fixed to the housing at an edge of the through-hole.

When the cable is fixed to the housing at the portion penetrating through the housing, even if the cable is pulled from the outside, a load is less likely to be applied to the connected portion at which the cable is soldered. In contrast, in the assembly of the photosensor, since the cable is fixed to the housing and cannot be moved freely, it becomes difficult to solder the cable to the circuit board. However, according to this embodiment, the work of soldering the cable to the circuit board can be omitted. Even a cable fixed to the housing can be easily mounted on the circuit board.

Effects

According to the disclosure, it is possible to provide a photosensor in which a cable can be easily mounted on a circuit board.

DESCRIPTION OF THE EMBODIMENTS

Figure 1:
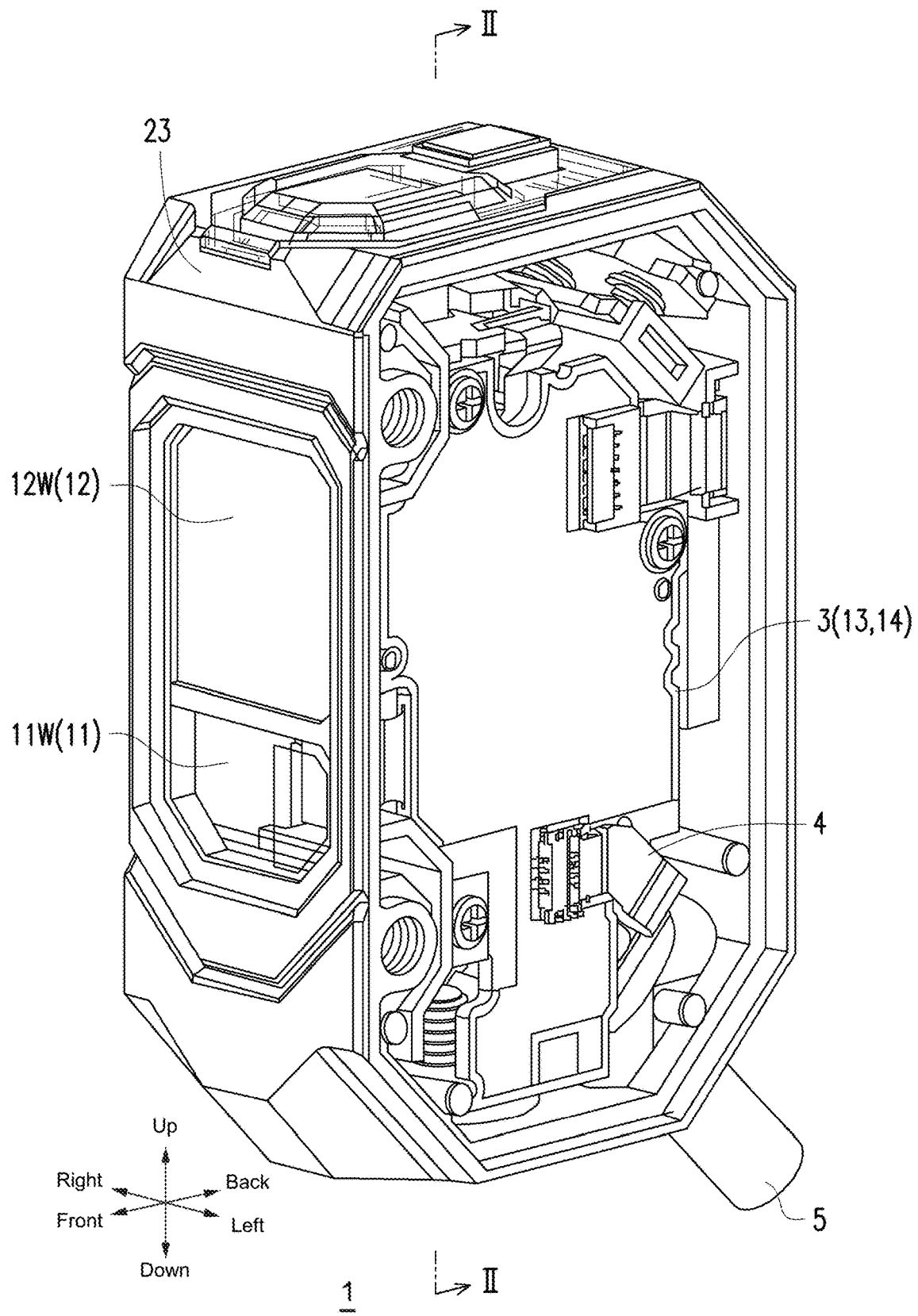
FIG. 1 is a perspective view showing a photosensor according to an embodiment of the disclosure.

Preferred embodiments of the disclosure will be described with reference to the accompanying drawings. In the drawings, parts labeled with the same reference numerals have the same or similar configurations. In FIG. 1 to FIG. 6, as an example of a photosensor 1, a photoelectric sensor including a light projecting part that emits light and a light receiving part that receives light is disclosed. The amount of light that reaches the light receiving part changes as the projected light is blocked or reflected by a workpiece. The photoelectric sensor may detect this change, convert it into an electric signal, and output it to an external device.

However, the photosensor 1 is not limited to the photoelectric sensor. The photosensor 1 may be a displacement sensor that measures a distance from the sensor to an object by detecting a physical change amount of the object with an optical element and calculating the change amount into a distance, the photosensor 1 may also be an image sensor that calculates an area, a center of gravity, a length, a position, etc. of an object by image processing an image captured by a camera and outputs a data and a determination result, or the photosensor 1 may also be a code reader that reads a barcode or a two-dimensional code.

In the photosensor 1 according to an embodiment of the disclosure, a cable 5 for supplying power from an external power source to a first circuit board 3 and transmitting a signal processed by the first circuit board 3 to an external device is not soldered to the first circuit board 3. The cable 5 is soldered to a second circuit board 4 and is connected to the first circuit board 3 via the second circuit board 4.

The first circuit board 3 is composed of a printed wiring board of a rigid board that may be mounted at a high density; in contrast, the second circuit board 4 is composed of a printed wiring board of a flexible board that may be greatly elastically deformed. The cable 5 may be mounted on the first circuit board 3 simply by inserting a second connector 44 provided on the second circuit board 4 into a first connector 34 provided on the first circuit board 3. Hereinafter, each configuration will be described in detail with reference to FIG. 1 to FIG. 6.

FIG. 1 is a perspective view showing a photosensor 1 according to an embodiment of the disclosure. In the illustrated example, the photosensor 1 is configured as a retroreflective photoelectric sensor, is built-in with a light projecting part 11, a light receiving part 12, an amplification part 13, a control part 14, etc., and is connected to an external power source or an external device via a cable 5 penetrating through a housing 2. The photosensor 1 may also be configured as a transmissive photoelectric sensor and house the light projecting part 11 and the light receiving part 12 respectively in separate housings 2 and 2. The photosensor 1 may also be configured as an amplifier-separated photoelectric sensor with the amplification part 13 separated outside the housing 2, or may also be configured as a built-in power supply photoelectric sensor with a power supply part built in the housing 2.

The housing 2 is formed of a metal material such as stainless steel or zinc die casting, except for window parts 11W and 12W at which the light projecting 11 and the light receiving part 12 are provided. However, the material of the housing 2 is not limited to the metal material. For example, the housing 2 may also be formed of a resin material such as polybutylene terephthalate resin or ABS resin. The window parts 11W and 12W are formed of a light-transmitting material such as methacrylic resin or glass.

Figure 2:
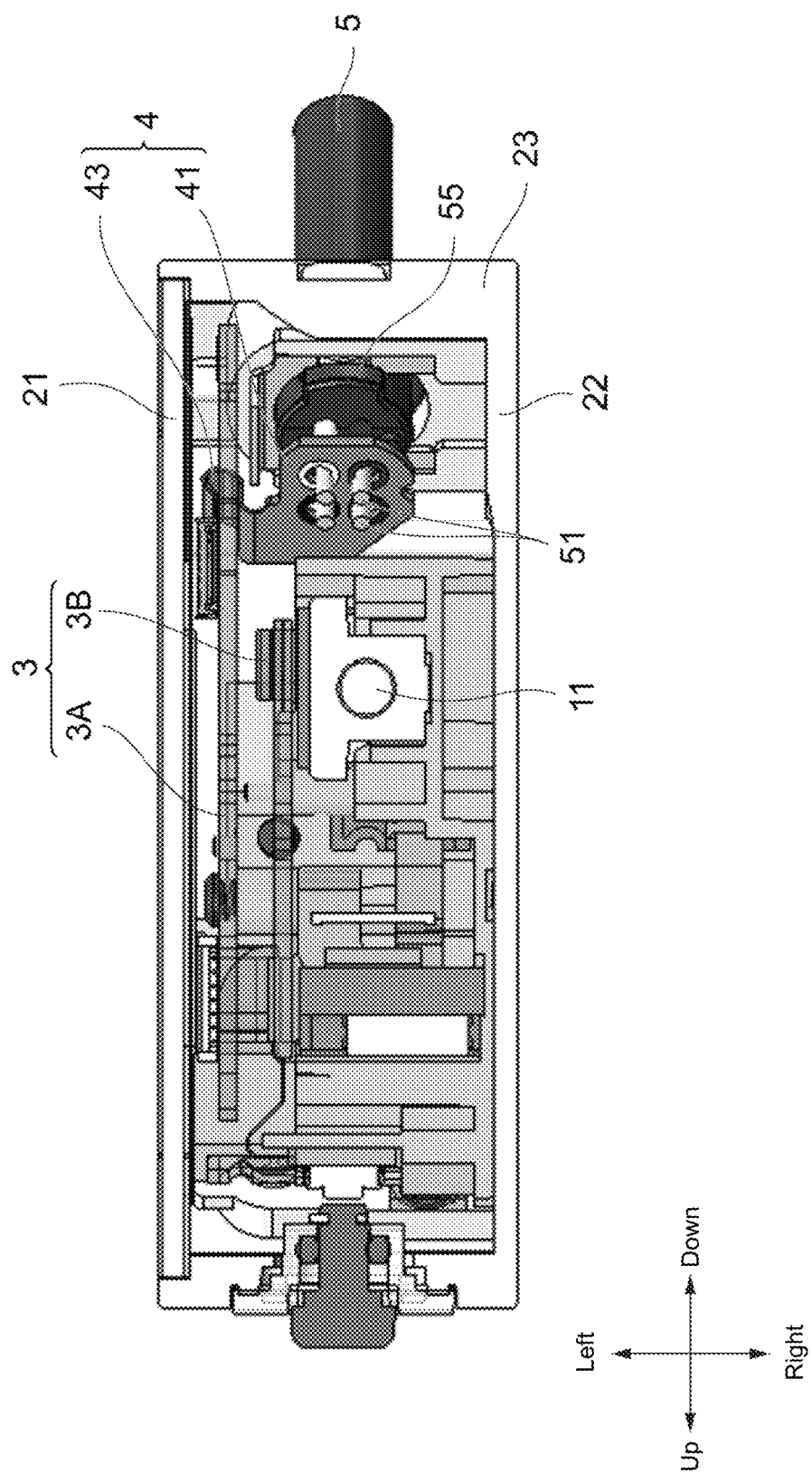
FIG. 2 is a cross-sectional view taken along line II-II in FIG. 1.

FIG. 2 is a cross-sectional view taken along line II-II in FIG. 1. As shown in FIG. 2, the housing 2 includes a case body 20 formed in a substantially rectangular parallelepiped cup shape, and a lid 21 covering the opening of the case body 20. The case body 20 includes a bottom wall 22 and a peripheral wall 23 that extends up from the bottom wall 22 toward the lid 21. In the housing 2, the bottom wall 22 is located on the opposite side of the lid 21.

In the illustrated example, a substantially circular through-hole 24 is formed in the peripheral wall 23. The through-hole 24 may also be formed on the bottom wall 22. The cable 5 is inserted through the through-hole 24. The cable 5 has a plurality of strands 51 and an outer jacket 52 for bundling the plurality of strands 51. The strand 51 has a core wire composed of a plurality of conductive wires and an inner jacket covering the core wire. The outer jacket 52 is formed in a cylindrical shape having substantially the same diameter as the through-hole 24. The through-hole 24 may also be substantially oval. In that case, the outer jacket 52 may also have a tubular shape having a substantially oval cross section.

The first circuit board 3 is housed in the housing 2. When a high-performance photosensor 1 capable of detecting various workpieces is configured, the size of the first circuit board 3 becomes large in order to perform complex processing. Instead of increasing the size of the housing 2 according to the first circuit board 3, the first circuit board 3 may be divided to be a size equal to or smaller than a size that can be housed in the housing 2.

In the illustrated example, the first circuit board 3 is divided into two parts including a first A circuit board 3A and a first B circuit board 3B. Although not shown, the first circuit board 3 may also be divided into three or more parts. The first A circuit board 3A is arranged along the lid 21 of the housing 2. The first B circuit board 3B is arranged along the first A circuit board 3A. The first circuit board 3 (the first A and first B circuit boards 3A and 3B) may also be arranged along the bottom wall 22.

Figure 3:
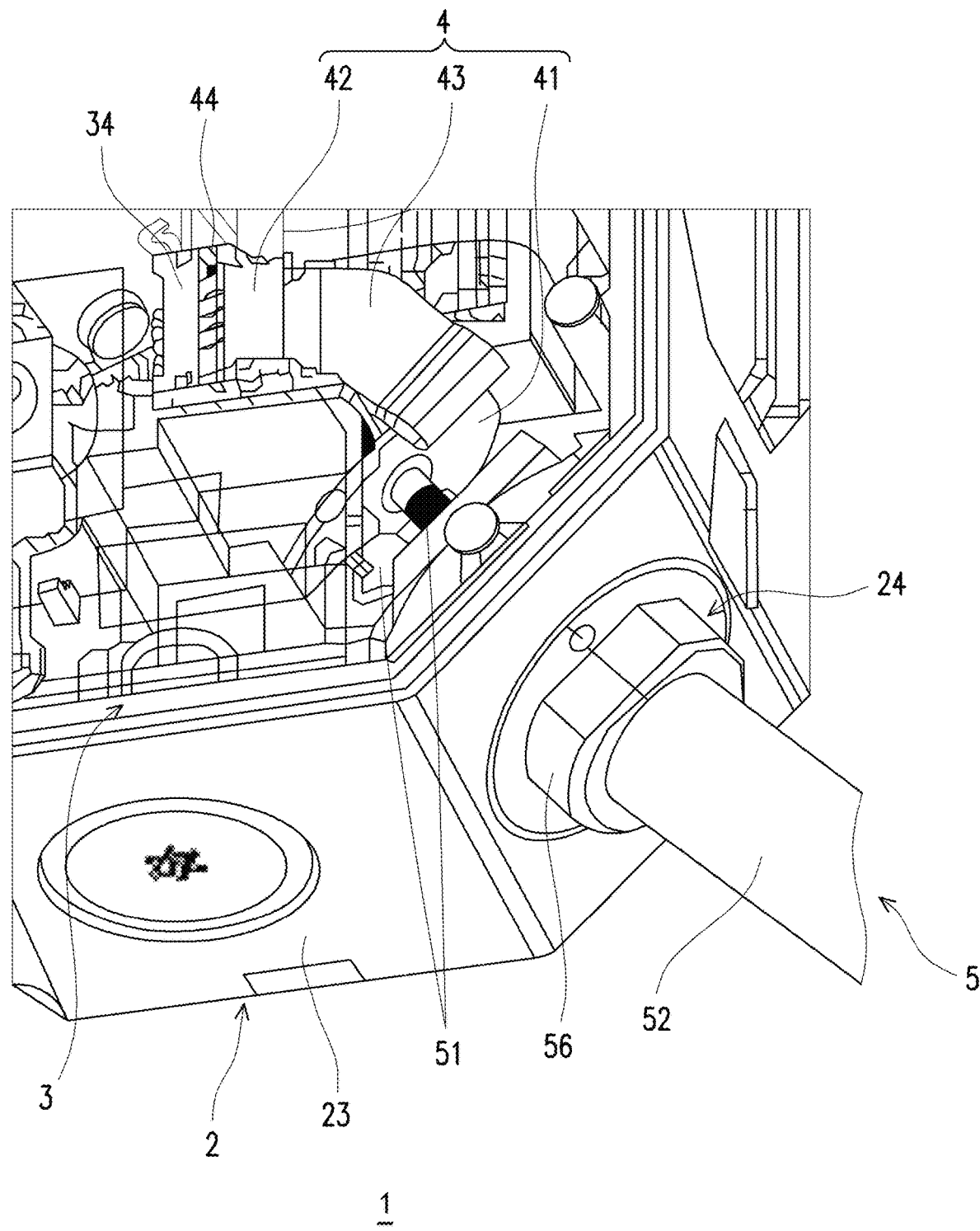
FIG. 3 is an enlarged perspective view showing the vicinity of a through-hole shown in FIG. 1.

FIG. 3 is an enlarged perspective view showing the vicinity of the through-hole 24. As shown in FIG. 3, in the first circuit board 3, electronic components and a first connector 34 are mounted on a printed wiring board of a rigid board on which a wiring pattern such as copper foil is printed on a base material in which glass fiber is impregnated with epoxy resin or the like. The electronic components may be mounted on two surfaces of the printed wiring board or may be mounted on one surface only. The electronic components mounted on the first circuit board 3 constitute, for example, the amplification part 13 and the control part 14 described above.

One of the features of the photosensor 1 of this embodiment is that it includes a second circuit board 4 that electrically and mechanically connects the first circuit board 3 and the cable 5.

At least a part of the printed wiring board of the second circuit board 4 is a flexible board on which a wiring pattern such as copper foil is printed on a film such as polyimide resin, and may be greatly elastically deformed. In the illustrated example, the printed wiring board of the second circuit board 4 is all composed of a flexible board. The printed wiring board constituting the second circuit board 4 may also be a flex-rigid board combining a flexible board and a rigid board.

The second circuit board 4 has a first portion 41, a second portion 42, and a third portion 43 connecting the first portion 41 and the second portion 42. In the illustrated example, the first portion 41 is located at a first end part at one end of the second circuit board 4 and its vicinity, and the second portion 42 is located at a second end part at another end of the second circuit board 4 and its vicinity. The positions of the first portion 41 and the second portion 42 are not limited to the two end parts of the second circuit board 4. The first portion 41 and the second portion 42 may also be located between the first end part and the second end part.

The first portion 41 is composed of a flexible board and is formed in such a size that it cannot pass through the through-hole 24 in a non-elastically deformed state but can pass through the through-hole 24 in an elastically deformed state. Specifically, it is formed to have a width larger than the diameter of the through-hole 24 excluding a recess 25 to be described later. Each strand 51 of the cable 5 is soldered to the wiring pattern of the first portion 41 to be electrically and mechanically connected. The second portion 42 is provided with a second connector 44 that can be inserted into and removed from the first connector 34. The second connector 44 is inserted into the first connector 34 to be electrically and mechanically connected.

Figure 4:
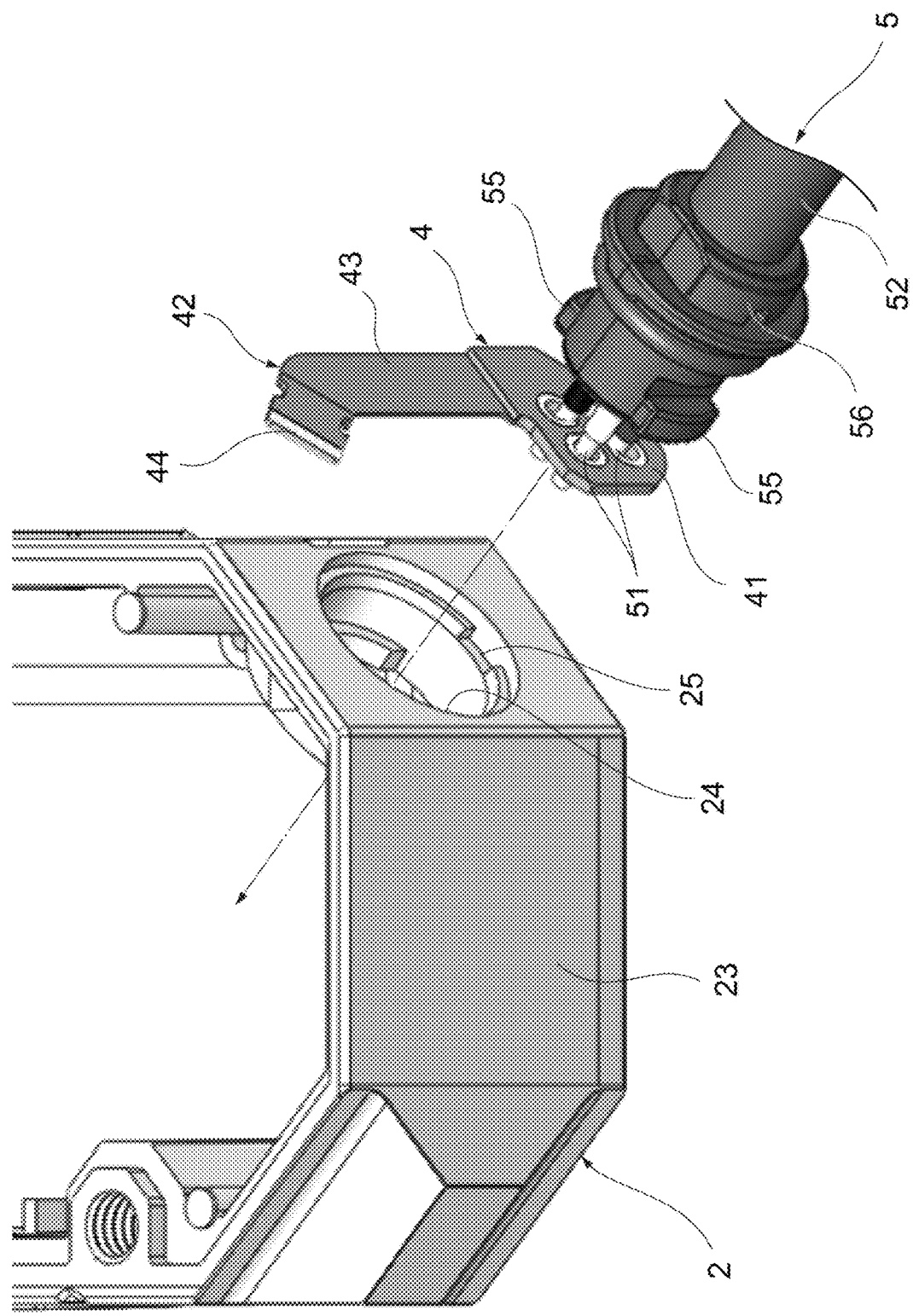
FIG. 4 is a perspective view showing a state before a second circuit board is inserted into the through-hole and arranged in the housing.
Figure 5:
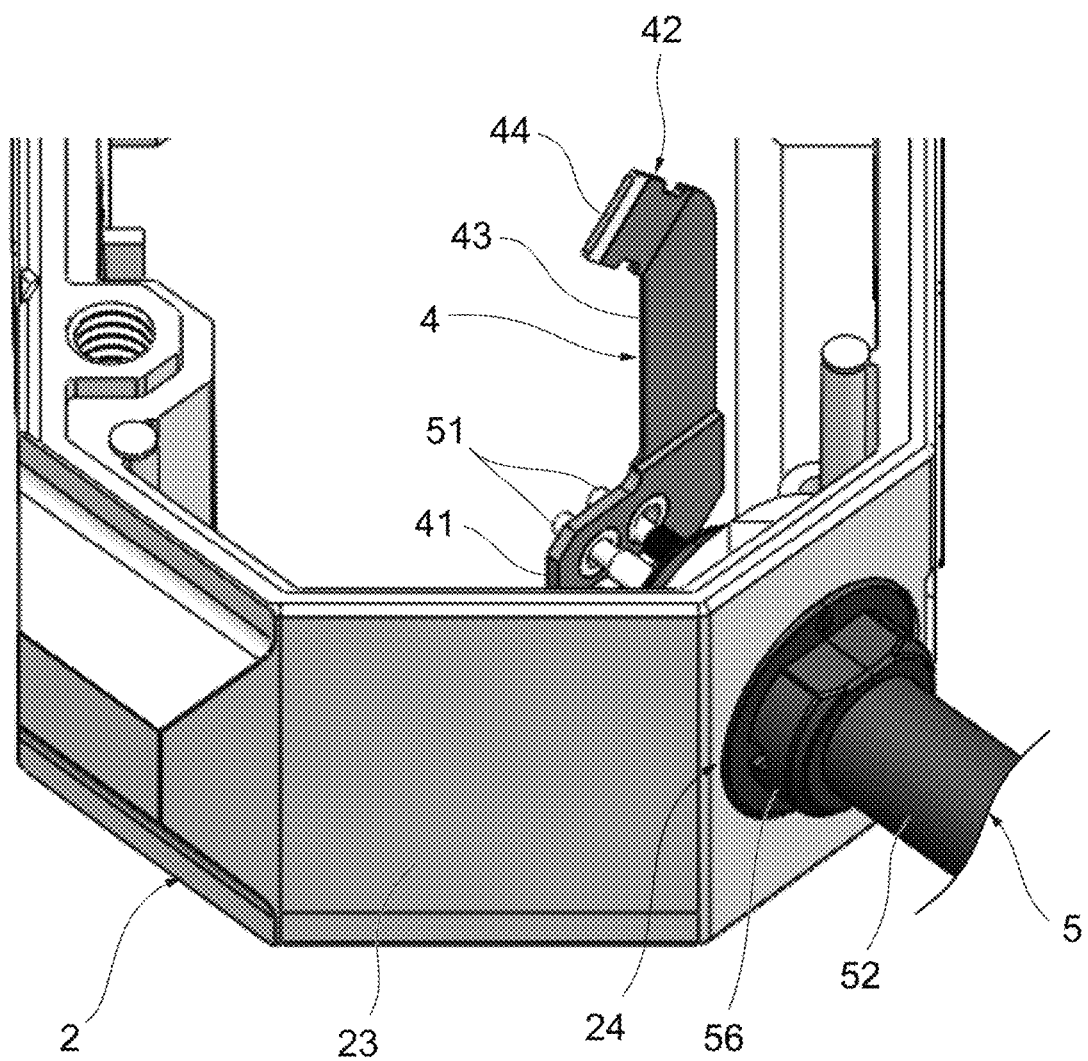
FIG. 5 is a perspective view showing a state after the second circuit board is inserted into the through-hole and arranged in the housing.

Next, a process of manufacturing the photosensor 1 will be described with reference to FIG. 4 to FIG. 6. FIG. 4 is a perspective view showing a state before the second circuit board 4 is inserted into the through-hole 24 and arranged in the housing 2. FIG. 5 is a perspective view showing a state after the second circuit board 4 is inserted into the through-hole 24 and arranged in the housing 2. As shown in FIG. 5, the cable 5 is fixed to the housing 2 at the edge of the through-hole 24.

As shown in FIG. 4, the cable 5 is provided with a protrusion 55 protruding from the outer jacket 52. A flange part 56 that spreads radially from the outer jacket 52 is provided on the opposite side of the protrusion 55 with the portion to be inserted through the through-hole 24 interposed therebetween. The flange part 56 may be provided with a packing for dustproofing and waterproofing. In the through-hole 24, a recess (notch) 25 is formed at a position corresponding to the protrusion 55. When the protrusion 55 is passed through the recess 25 and rotated by 90° (see FIG. 4), the cable 5 may be fixed to the housing 2 (see FIG. 5). The protrusion 55 and the flange part 56 may be externally attached to the outer jacket 52 or may be integrally formed.

Figure 6:
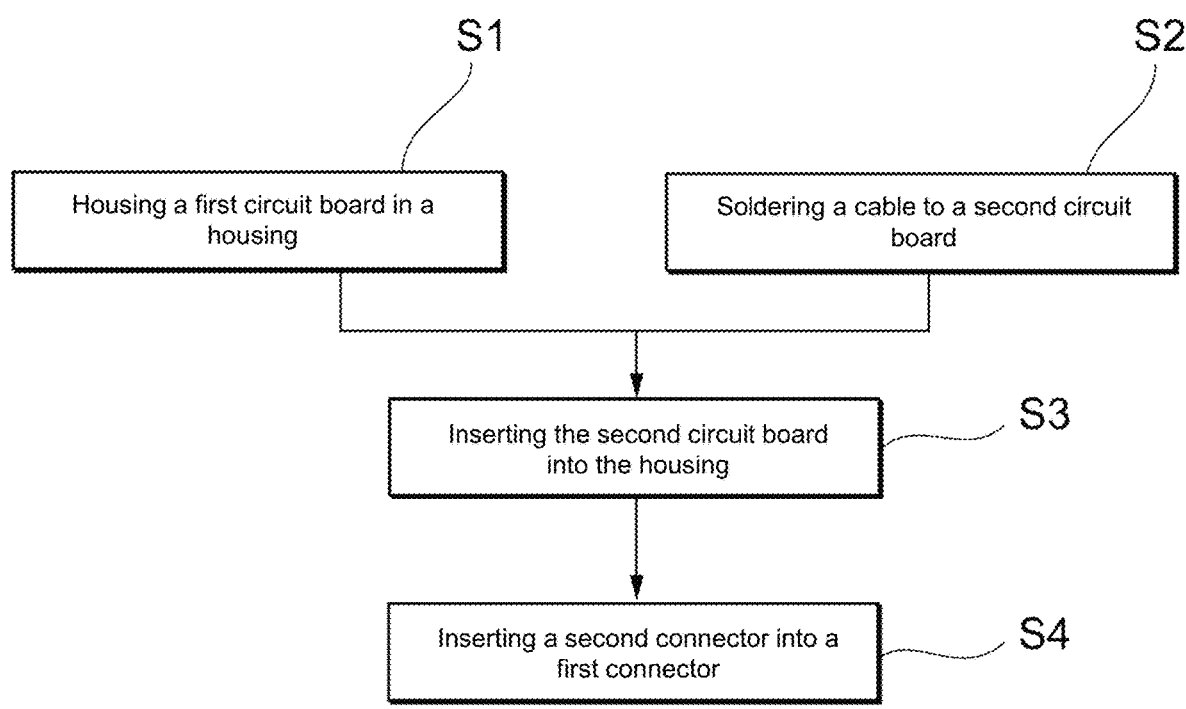
FIG. 6 is a view showing an example of a process of manufacturing the photosensor according to an embodiment of the disclosure.

FIG. 6 is a view showing an example of a process of manufacturing the photosensor 1. To manufacture the photosensor 1, a first circuit board is housed in a housing 2 (step S1). The first circuit board 3 is provided with a first connector 34. A through-hole 24 is formed in the housing 2. Next, strands 51 of a cable 5 are soldered to a wiring pattern of a second circuit board 4 to electrically and mechanically connect the second circuit board 4 and the cable 5 (step S2). Steps S1 and S2 may be performed in a reverse order.

Next, the second circuit board 4 with the cable 5 soldered is inserted from the through-hole 24 and arranged in the housing 2 (step S3). At this time, the cable 5 may be fixed to the housing 2 as described with reference to FIG. 4 and FIG. 5. Next, a second connector 44 is inserted into the first connector 34 to electrically and mechanically connect the first circuit board 3 and the second circuit board 4 (step S4). Accordingly, the cable 5 is electrically connected to the first circuit board 3.

According to the photosensor 1 of this embodiment configured as described above, the cable can be easily mounted on the first circuit board via the second circuit board. As shown in FIG. 6, in the housing 2, it is only necessary to insert the second connector 44 into the first connector 34. Since the cable 5 is soldered outside the housing 2 and connected in advance to the second circuit board 4, soldering inside the housing 2 can be omitted.

As shown in FIG. 3, the cable 5 is fixed to the housing 2 at the edge of the through-hole 24. When the cable 5 is fixed to the housing 2, even if the cable 5 is pulled from the outside, the load is less likely to be applied to the connected portion at which the cable 5 is soldered. In contrast, in the assembly of the photosensor 1, since the cable 5 is fixed to the housing 2 and cannot be moved freely, it becomes difficult to solder the cable 5 to the circuit board.

According to this embodiment, since the work of soldering the cable 5 to the first circuit board 3 can be omitted, even a cable 5 fixed to the housing 2 can be easily mounted on the first circuit board 3. Since it is not necessary to extend the tip of the cable 5 and solder it, as shown in FIG. 1 and FIG. 2, the housing 2 can be compactly configured by omitting the space for housing the extended cable 5.

At least a part of the printed wiring board of the second circuit board 4 is composed of a flexible board instead of a rigid board. Since the second circuit board 4 may be elastically deformed, it is easy to insert the second connector 44 into the first connector 34 in the assembly of the photosensor 1. The second circuit board 4 with the cable 5 connected can be easily mounted on the first circuit board 3. In the example shown in FIG. 3, although the printed wiring board of the second circuit board 4 is all a flexible board, it may also be a flex-rigid board combining a flexible board and a rigid board.

As shown in FIG. 4 and FIG. 5, the first portion 41 of the second circuit board 4 is formed in a size that cannot pass through the through-hole 24 unless it is elastically deformed. Since a large mounting area partitioned in the first portion 41 can be secured, the cable 5 can be easily soldered to the second circuit board 4, and the connection reliability between the second circuit board 4 and the cable 5 can be improved.

The embodiments described above are intended to facilitate the understanding of the disclosure and are not intended to limit the interpretation the disclosure. Each element included in the embodiments and its arrangement, material, condition, shape, size, etc. are not limited to those exemplified herein and may be changed as appropriate. In addition, the configurations shown in different embodiments may be partially replaced or combined.

[Appendix 1]

A photosensor (1) including:

a housing (2) in which a through-hole (24) is formed;

a cable (5) inserted through the through-hole (24);

a first circuit board (3) housed in the housing (2) and provided with a first connector (34); and a second circuit board (4) connecting the cable (5) and the first circuit board (3), where the second circuit board (4) has a first portion (41) to which the cable (5) is soldered, and a second portion (42) provided with a second connector (44) inserted into the first connector (34).

[Appendix 2]

A method of manufacturing a photosensor (1), including:

a step (S1) of housing a first circuit board (3) provided with a first connector (34) in a housing (2) in which a through-hole (24) is formed;

a step (S2) of soldering a cable (5) to a second circuit board (4) provided with a second connector (44) capable of being inserted into and removed from the first connector (34) to connect the second circuit board (4) and the cable (5);

a step (S3) of inserting from the through-hole (24) the second circuit board (4) soldered with the cable (5) and arranging in the housing (2); and a step (S4) of inserting the second connector (44) into the first connector (34) to connect the first circuit board (3) and the second circuit board (4).

What is claimed is:

1. A photosensor comprising:

a housing in which a through-hole is formed;

a cable inserted through the through-hole;

a first circuit board housed in the housing and provided with a first connector; and a second circuit board connecting the cable and the first circuit board, wherein the second circuit board has a first portion to which the cable is soldered, and a second portion provided with a second connector inserted into the first connector.

2. The photosensor according to claim 1, wherein at least a part of the second circuit board is composed of a flexible board.

3. The photosensor according to claim 2, wherein the first portion is composed of a flexible board and is formed in a size incapable of passing through the through-hole in a non-elastically deformed state but capable of passing through the through-hole in an elastically deformed state.

4. The photosensor according to claim 1, wherein the cable is fixed to the housing at an edge of the through-hole.

5. A method of manufacturing a photosensor, comprising:

a step of housing a first circuit board provided with a first connector in a housing in which a through-hole is formed;

a step of soldering a cable to a second circuit board provided with a second connector capable of being inserted into and removed from the first connector to connect the second circuit board and the cable;

a step of inserting from the through-hole the second circuit board soldered with the cable and arranging in the housing; and a step of inserting the second connector into the first connector to connect the first circuit board and the second circuit board.

6. The photosensor according to claim 2, wherein the cable is fixed to the housing at an edge of the through-hole.

7. The photosensor according to claim 3, wherein the cable is fixed to the housing at an edge of the through-hole.

* * * * *